United States Patent
Axelsson et al.

(10) Patent No.: US 11,579,204 B2
(45) Date of Patent: Feb. 14, 2023

(54) METHOD AND ELECTRONIC DEVICE FOR MANAGING POWER LIMIT

(71) Applicant: Ningbo Geely Automobile Research & Development Co., Ltd., Ningbo (CN)

(72) Inventors: Bengt Axelsson, Västra Frölunda (SE); Sri Vishnu Gorantla Narayana Murthy, Gothenburg (SE); Sandeep David, Gothenburg (SE); Nareerat Plylahan, Gothenburg (SE)

(73) Assignee: NINGBO GEELY AUTOMOBILE RESEARCH & DEVELOPMENT CO., Ningbo (CN)

( * ) Notice: Subject to any disclaimer, the term of this patent is extended or adjusted under 35 U.S.C. 154(b) by 463 days.

(21) Appl. No.: 16/724,271

(22) Filed: Dec. 21, 2019

(65) Prior Publication Data

US 2020/0124681 A1    Apr. 23, 2020

Related U.S. Application Data

(63) Continuation of application No. PCT/CN2018/090262, filed on Jun. 7, 2018.

(30) Foreign Application Priority Data

Jul. 3, 2017 (EP) .................... 17179275

(51) Int. Cl.
*G01R 31/392* (2019.01)
*H01M 10/48* (2006.01)
(Continued)

(52) U.S. Cl.
CPC ............ *G01R 31/392* (2019.01); *B60L 58/12* (2019.02); *B60L 58/16* (2019.02); *G01R 31/374* (2019.01);
(Continued)

(58) Field of Classification Search
None
See application file for complete search history.

(56) References Cited

U.S. PATENT DOCUMENTS

2012/0176096 A1* 7/2012 Mumelter ............. H02J 7/0048
320/134
2012/0316714 A1   12/2012 Nagayanagi
(Continued)

FOREIGN PATENT DOCUMENTS

CN    104691539 A    6/2015
CN    105098869 A    11/2015
(Continued)

OTHER PUBLICATIONS

Extended European Search Report from corresponding European Application No. 17179275.7, dated Jan. 12, 2018, 7 pages.
(Continued)

*Primary Examiner* — Patrick Assouad
*Assistant Examiner* — Haidong Zhang
(74) *Attorney, Agent, or Firm* — Tucker Ellis LLP (57) ABSTRACT

An electronic device and a method performed in an electronic device for managing the power limit of a battery of a vehicle. The method including obtaining a first State of Health value of the battery at a first time, obtaining a second State of Health value of the battery at a second time, determining a rate of change of State of Health value of the battery, determining a power value by calculating a function that is dependent on the rate of change of State of Health of the battery and adjusting the power limit of the battery to the determined power value for managing the life time of the battery.

13 Claims, 4 Drawing Sheets

(51) Int. Cl.
*H01M 10/42* (2006.01)
*B60L 58/16* (2019.01)
*B60L 58/12* (2019.01)
*G01R 31/387* (2019.01)
*G01R 31/374* (2019.01)
*G01R 31/389* (2019.01)

(52) U.S. Cl.
CPC ......... *G01R 31/387* (2019.01); *G01R 31/389* (2019.01); *H01M 10/425* (2013.01); *H01M 10/48* (2013.01); *B60L 2240/545* (2013.01); *H01M 2010/4271* (2013.01); *H01M 2220/20* (2013.01)

(56) References Cited

U.S. PATENT DOCUMENTS

2014/0302355 A1* 10/2014 Boehm ................ H01M 10/48
324/426

2015/0158395 A1 6/2015 Li
2015/0326038 A1 11/2015 Lee
2015/0364802 A1 12/2015 Bouyssou
2017/0120766 A1 5/2017 Huber

FOREIGN PATENT DOCUMENTS

| | | |
|---|---|---|
| CN | 106451682 A | 2/2017 |
| JP | 2011041441 A | 2/2011 |
| SE | 1100491 A1 | 9/2011 |
| WO | 2017038387 A1 | 3/2017 |

OTHER PUBLICATIONS

International Search Report and Written Opinion from corresponding Application No. PCT/CN2018/090262, dated Aug. 1, 2018, 11 pages.

\* cited by examiner

METHOD AND ELECTRONIC DEVICE FOR MANAGING POWER LIMIT

RELATED APPLICATION DATA

This application is a continuation of International Patent Application No. PCT/CN2018/090262, filed Jun. 7, 2018, which claims the benefit of European Patent Application No. 17179275.7, filed Jul. 3, 2017, the disclosures of which are incorporated herein by reference in their entireties.

TECHNICAL FIELD

The invention pertains to the field of managing a power limit and the life time of a battery.

BACKGROUND

Today it is very popular to use batteries for powering all kinds of electrical devices. Not only smaller home electronic devices such as smartphones, tablets and portable computers but also electrical devices such electrical bikes and electrical vehicles make use of batteries. There are different types of batteries, and in particular batteries that are rechargeable are commonly used.

A battery that is rechargeable has a certain so called State of Charge. The units of State of Charge are percentage points where 100% means fully charged battery and 0% means a fully discharged battery, i.e. a battery that is "empty". A battery is traditionally charged to a certain State of Charge. Then, when the battery is connected to an electronic device that consumes power form the battery, the battery is being discharged. After a certain time of usage, the battery is discharged to a lower State of Charge and needs to be charged to a higher State of Charge again. After the battery has been charged to a certain State of Charge the electronic device can be used again. This is then repeated as long as the battery is can be charged again.

A battery also has a certain so called State of Health. The units of State of Health are also percentage points of the condition of a battery compared to its ideal conditions where 100% means the battery's conditions match the battery's specifications. Typically at the time of manufacture the battery's State of Health is 100% but decreases over time and use of the battery.

To prevent damage of the battery the charge/discharge power is limited at certain conditions such as high/low temperature, high/low State of Charge and low State of health. For a vehicle battery such factors depends on the driving behaviour of a vehicle driver.

SUMMARY

Electric vehicles, from hybrids to full electric vehicles, require power control of the battery to ensure plural years of utilization of the vehicle battery.

The wearing of the vehicle battery depends on the driving behaviour of a vehicle driver. To prevent battery cell damage and ensure the safety of the battery, the charge/discharge power is limited at certain conditions such as at high/low temperature, high/low State of Charge and low State of Health. The power limit used in electrical vehicles today is fixed and hence the same for all driving behaviours. A vehicle driver with an aggressive driving behaviour will hence wear down the battery before the designed end of life time of the battery. At the same time, the battery will last longer than the designed end of life time with a well-driving vehicle driver.

Today there is a demand for optimized utilization of vehicle batteries in order to improve the battery life time. The inventors have identified that there is a need for a solution where an adaptive power limit is applied in order to reduce the power usage for an aggressive-driving vehicle drivers to prolong the vehicle battery life time, or at least meet the designed end of life time of the vehicle battery. At the same time there is a need for a solution where more power is offered to a well-driving vehicle driver and at the same time meet the designed end of life time.

An object of the present invention is to provide a method and a device which seek to mitigate, alleviate, or eliminate one or more of the above-identified deficiencies in the art and disadvantages singly or in any combination.

The invention proposes a method performed in an electronic device for managing a power limit of a battery of a vehicle. The method comprising obtaining a first State of Health value of the battery at a first time, obtaining a second State of Health value of the battery at a second time and then determining a rate of change of State of Health value, i.e. mathematically dSOH/dt, of the battery based on the first State of Health value of the battery at the first time and the second State of Health value of the battery at the second time. This is then followed by determining a power value by calculating a function that is dependent on the rate of change of State of Health of the battery and adjusting the power limit of the battery to the determined power value for managing the life time of the battery. The method is hence adjusting the power limit dependent on the driving behaviour of the vehicle driver in order to meet the designed End of Life value.

According to an aspect, the first State of Health value and the second State of Health value are obtained by measuring a value corresponding to at least one of the battery capacity or the battery internal impedance. Hence the State of Health values are obtained by measuring the same physical indicator of the battery at different times.

According to an aspect, the method further comprising obtaining a temperature of the battery. According to an aspect, the method further comprising obtaining a State of Charge of the battery. Hence the temperature and/or State of Charge can be used as input for managing the power limit.

According to an aspect, wherein determining the power value, the function is further dependent on at least one of the State of Charge; the Temperature; or the State of Health. This means that when determining a power value the function can also be dependent on the State of Charge; temperature and/or the State of Health, of the battery. The State of Health continuously decreases during the life time of the battery. How fast or how slow the State of Health is changing, i.e. if the rate of change of State of Health is high or low, depends on how the battery is used.

According to an aspect a higher rate of change of State of Health results in determining the power value to be lower than the power limit and access to lower power capabilities for meeting the designed lifetime of the battery. In other words, a fast change of the State of Health has a negative effect on the End of Life value and in order to minimize the harm to the battery the lower power limit is adjusted down to a lower power limit.

According to an aspect a lower rate of change of State of Health results in determining the power value to be higher than the power limit and access to higher power capabilities for meeting the designed lifetime of the battery. In other words, a slow change of the State of Health, has a positive effect on the End of Life value and in order to maximize the utilization of the battery, the lower power limit is adjusted up to a higher power limit.

According to an aspect adjusting the power limit to a lower power limit is ignored after detecting input from a driver of the vehicle accepting a shortening of the lifetime of the battery. This means that a driver of a vehicle can decide that the current driving experience is to be prioritized over the battery lifetime.

According to an aspect adjusting the power limit to a higher power limit is ignored after detecting input from a driver of the vehicle accepting a prolonging of the lifetime of the battery. This means that a driver of a vehicle can decide that the battery lifetime is to be prioritized over current driving experience. This means that the lifetime of the battery can be prolonged beyond the designed End of Life. Ignoring adjusting to a higher power limit is hence desired if the battery lifetime is to be prioritized.

According to an aspect an electronic device is configured for managing the life time of a battery in a vehicle. The electronic device comprising a memory and a processing circuitry. The processing circuitry is configured to cause the electronic device to obtain a first State of Health value of the battery at a first time and obtain a second State of Health value of the battery at a second time. The processing circuitry is then configured to cause the electronic device to determine a rate of change of State of Health value of the battery based on the first State of Health value of the battery at the first time and the second State of Health value of the battery at the second time and determine a power value by calculating a function that is dependent on the rate of change of State of Health of the battery. The processing circuitry is then configured to cause the electronic device to adjust the power limit of the battery to the determined power value for managing the life time of the battery. The electronic device is hence configured for adjusting the power limit dependent on the driving behaviour of the vehicle driver in order to meet the designed End of Life value.

According to an aspect the first State of Health value and the second State of Health value are obtained by measuring a value corresponding to at least one of the battery capacity or the battery internal impedance. Hence the State of Health values are obtained by measuring the same physical indicator of the battery at different times.

According to an aspect a higher rate of change of State of Health results in determining the power value to be lower than the power limit and access to lower power capabilities for meeting the designed lifetime of the battery. In other words, a fast change of the State of Health has a negative effect on the End of Life value and in order to minimize the harm to the battery the lower power limit is adjusted down to a lower power limit.

According to an aspect a lower rate of change of State of Health results in determining the power value to be higher than the power limit and access to higher power capabilities for meeting the designed lifetime of the battery. In other words, a slow change of the State of Health has a positive effect on the End of Life value and in order to maximize the utilization of the battery, the lower power limit is adjusted up to a higher power limit.

According to an aspect the processing circuitry is further configured to detect input from a driver of the vehicle accepting a shortening of the lifetime of the battery and ignore to adjust the power limit to a lower power limit. This means that a driver of a vehicle can decide that the current driving experience is to be prioritized over the battery lifetime.

According to an aspect the processing circuitry is further configured to detect input from a driver of the vehicle accepting a prolonging of the lifetime of the battery. This means that a driver of a vehicle can decide that the battery lifetime is to be prioritized over current driving experience.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the example embodiments.

DETAILED DESCRIPTION OF EXAMPLE EMBODIMENTS

Aspects of the present invention will be described more fully hereinafter with reference to the accompanying drawings. The method and device disclosed herein can, however, be realized in many different forms and should not be construed as being limited to the aspects set forth herein. Like numbers in the drawings refer to like elements throughout.

The terminology used herein is for the purpose of describing particular aspects of the invention only, and is not intended to limit the invention. As used herein, the singular forms "a", "an" and "the" are intended to include the plural forms as well, unless the context clearly indicates otherwise.

In some implementations and according to an aspect, the functions or steps noted in the blocks can occur out of the order noted in the operational illustrations. For example, two blocks shown in succession can in fact be executed substantially concurrently or the blocks can sometimes be executed in the reverse order, depending upon the functionality/acts involved.

In the drawings and specification, there have been disclosed exemplary aspects of the invention. However, many variations and modifications can be made to these aspects without substantially departing from the principles of the present invention. Thus, the disclosure should be regarded as illustrative rather than restrictive, and not as being limited to the particular aspects discussed above. Accordingly, although specific terms are employed, they are used in a generic and descriptive sense only and not for purposes of limitation.

It should further be noted that any reference signs do not limit the scope of the claims, that the example embodiments may be implemented at least in part by means of both hardware and software, and that several "means", "units" or "devices" may be represented by the same item of hardware.

Today it is common to use batteries to power all kinds of electrical devices. A battery that is rechargeable has a certain State of Charge, SOC. The units of State of Charge, SOC, are percentage points where 100% means fully charged battery and 0% means a fully discharged battery, i.e. a battery that is "empty". A battery is traditionally charged to a certain State of Charge, SOC. A battery also has a certain so called State of Health, SOH. The units of State of Health, SOH, are also percentage points of the condition of a battery compared to its ideal conditions where 100% means the battery's conditions match the battery's specifications. Typically at the time of manufacture the battery's State of Health, SOH, is 100% but decreases over time and use of the battery. The State of Health, SOH, does not correspond to any particular Physical value instead different manufacturers have different ways to determine the State of Health value of a battery. There are different physical parameters that are being used for determining the State of Health value, in particular one or more of the battery internal resistance, the battery internal impedance, the battery internal conductance, the battery capacity, the battery voltage etc. There are also other factors that can be taken in consideration for determining the State of Health, SOH, value such as the number of times the battery has been charged/discharged.

Electric vehicles, from hybrids to full electric vehicles, require power control of the battery to ensure plural years of utilization of the vehicle battery. The wearing of the vehicle battery depends on the driving behaviour of a vehicle driver. To prevent battery cell damage and ensure the safety of the battery, the charge/discharge power is limited at certain conditions such as at high/low temperature, high/low State of Charge, SOC, and low State of Health, SOH. The power limit used in electrical vehicles today is fixed and hence the same for all driving behaviours. A vehicle driver with an aggressive driving behaviour will hence wear down the battery before the designed end of life time of the battery. At the same time, the battery will last longer than the designed end of life time with a well-driving vehicle driver.

The inventors have identified that there is a need for a solution where an adaptive power limit is applied in order to reduce the power usage for an aggressive-driving vehicle drivers to prolong the vehicle battery life time, or at least meet the designed end of life time of the vehicle battery. At the same time there is a need for a solution where more power is offered to a well-driving vehicle driver and at the same time meet the designed end of life time.

Traditionally the fixed power limit, P lim, depends on a function:

$$P\ \mathrm{lim}=f(SOC,T,SOH,\ldots)$$

The inventors have identified that when the rate of change of State of

Health value, dSOH/dt, of the battery is considered an adaptive power limit PA lim which can be expressed as:

$$PA\ \mathrm{lim}=f(SOC,T,SOH,\ldots,dSOH/dt)$$

Where the dSOH/dt represents the rate of change of State of Health, SOH, of the battery with time. For an aggressive driving behaviour dSOH/dt is high and thus a lower power limit will be applied to the driver to reduce the stress on the battery and prolong its lifetime. For a smooth driving behavior dSOH/dt is lower and thus a higher power limit can be offered to the driver without compromising on the lifetime of the battery.

Figure 1:
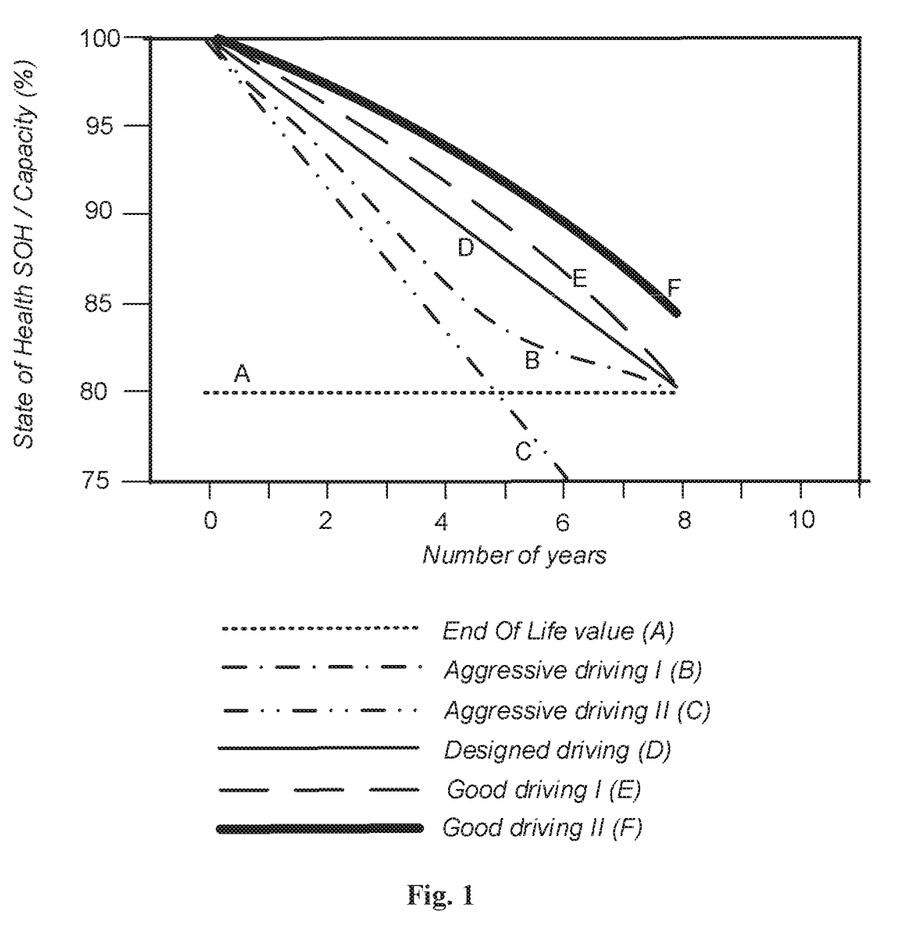
FIG. 1 illustrates a graph with battery State of Health degradation curves dependent on different driving behaviours.

Reference is now made to FIG. 1 that illustrates a graph with battery State of Health degradation curves with and without adaptive power limit implemented which is dependent on different driving behaviours. In the example in FIG. 1 the battery 40 is designed to reach its End of Life in 8 years with 80% of the initial battery capacity left. This is represented with the line A, End of Life value, in FIG. 1. If the driving behaviour is harsh, with the fixed power limit, the battery reaches its End of Life long before the designed 8 years as represented with the line C, Aggressive driving II, in FIG. 1. This can be avoided by having an adaptive power limit where the reduced power is made available to the driver, thus, prolonging the lifetime of the battery to 8 years as represented with the line B, Aggressive driving I, in FIG. 1.

For a well behaved driver, there can be two ways to reach the End of Life criteria. One way is to follow the line E, Good driving I, in FIG. 1, where the power limit of the battery pack is increased so that the battery pack reaches its End of Life at 8 years. The other way is represented by the line F, Good driving II, in FIG. 1, where the power limit is regulated to prolong the lifetime. Here the battery pack reaches its End of Life after 8 years.

Care must be taken to limit the influence of rate of change of power limit on the State of Health, SOH, of the battery. In one example the State of Health, SOH, of the battery changes slowly, this means that the power limit also change slowly in accordance with the State of Health, SOH. This slow change in the power limit is usually non-noticeable by the driver, thus, the driver can still experience the driving pleasure without compromising on the lifetime of the battery pack.

With the current fixed power limit, smooth good driving results in that the battery meets the designed End of Life for the battery illustrated with the line D, designed driving, in FIG. 1. With the current fixed power limit, aggressive driving results in that the battery lifetime decreases illustrated with the line C, Aggressive driving II, in FIG. 1. The power limit remains the same, fixed.

With and adaptive power limit, PA lim, as identified by the inventors, smooth good driving is results in an increased power limit, giving access to higher power capabilities. In one example access to higher power capabilities can be accepted or ignored by the driver. If access to higher power capabilities can is accepted, then the battery will meet the designed lifetime. This is illustrated with the line E, Good driving I, in FIG. 1. If access to higher power capabilities is rejected, then the battery can have a longer lifetime than the designed lifetime. This is illustrated with the line F, Good driving II, in FIG. 1.

With and adaptive power limit, PA lim, as identified by the inventors, aggressive driving results in a reduced power limit, giving access to lower power capabilities. The lower power capabilities results in that the battery will meet the designed lifetime. This is illustrated with the line B, Aggressive driving I, in FIG. 1

Figure 2A:
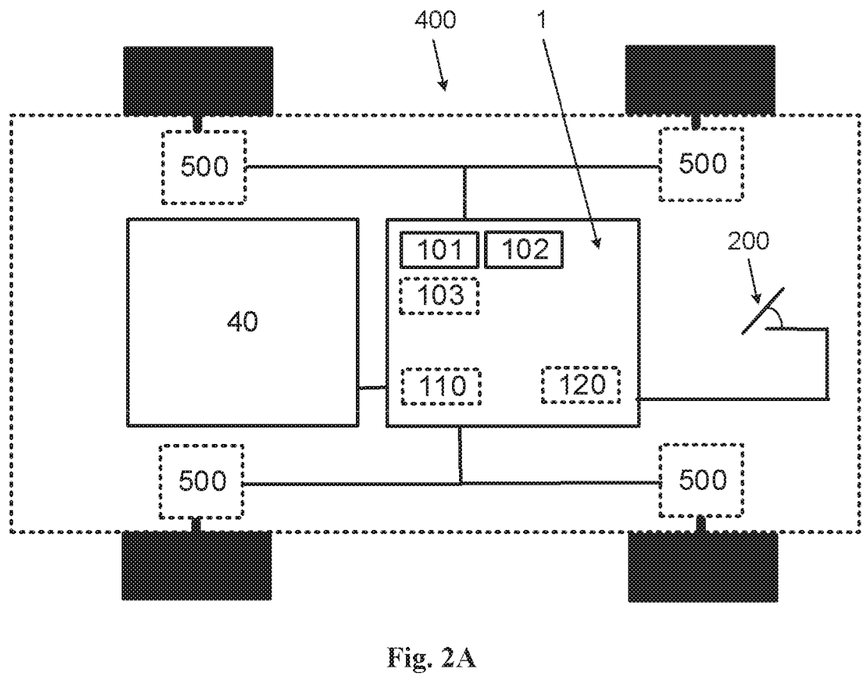
FIG. 2A illustrates an example of an electronic device in an electric vehicle according to an aspect.

Reference is now made to FIG. 2A that illustrates an example of an electronic device 1 in a vehicle 400, e.g. a hybrid vehicle or fully electric vehicle, according to an aspect. The invention also proposes an electronic device 1 configured for managing the life time of a battery 40 in a vehicle 10.

A illustrated in the example in FIG. 2A, the vehicle 400 comprises a battery 40 connected to the electronic device 1. The electronic device 1 comprising a memory 101 and a processing circuitry 102.

The memory 101 can be a Random-access Memory, RAM; a Flash memory; a hard disk; or any storage medium that can be electrically erased and reprogrammed. The processing circuitry 102 can be a Central Processing Unit, CPU, or any processing unit carrying out instructions of a computer program or operating system.

According to an aspect, as illustrated in FIG. 2a, the electronic device 1 further comprising at least one of a user interface unit 103, a measurement unit 110 and a control unit 120. The user interface unit 103 is typically configured for input and output of information from/to a user of the electronic device 1. In the example of a vehicle the user can be the driver of the vehicle. In one example the user interface unit 103 is a touch sensitive display but can be any input/output device.

According to an aspect the measurement unit 110 detects and obtains a physical value of the battery 40. In one example one or more seniors in, or connected to, the measurement unit 110 and the battery 40, detects and obtains the physical value of the battery. In one example a State of Health value can be determined by first measuring a physical value by the measurement unit 110, the physical value corresponding to at least one of the battery capacity or the battery internal impedance.

According to an aspect the measurement unit 110 detects and obtains a voltage value of the battery 40. In one example the voltage value is then used as an input parameter value for determining the State of Charge value of the battery 40.

In one example data form a known discharge function, or curve, of the battery 40 together with the voltage value can be used in order to determine the State of Charge value of the battery 40.

In one example the voltage is measured and the State of Charge of the battery 40 is obtained by further measuring the battery temperature and the battery current.

The measurement unit 110 can be adapted to detect other measurement data than voltage such as impedance, resistance, current, heat, pressure, gravity, pH and other data relating to the State of Charge, SOC and/or State of Health, SOH, of the battery 40. According to an aspect, at least one of any known methods such as chemical method, voltage method, current integration method, Kalman filtering or pressure method is applied in order to obtain a State of Charge value.

According to an aspect the control unit 120 controls the power limit, PA lim, of the battery 40. In one example the control unit 120 comprises electric circuits that are adapted for controlling the power available from the battery 40 to e.g. electrical motors 500 that are in connection with the battery 40 and being used for driving the vehicle 400. The power form the battery 40 needed for powering the motors 500 is dependent on the driving behaviour. The FIG. 2A also illustrates a accelerator pedal 200 of the vehicle 400. The driver of the vehicle 400 controls the acceleration of the vehicle 400 with the accelerator pedal 200. A driver requiring a fast acceleration and/or fast speed of the vehicle 400 will demand the battery 40 to deliver more power to the electrical motors 500.

In one example the processing circuitry 102 instructs the control unit 120 when and how to adjust the power limit, PA lim. The power limit, PA lim, can in one example be a limit for both discharging and charging. According to an aspect the control unit 120 controls the charging of the battery 40. Charging of the battery typically occurs during retardation of the vehicle 400. In one example the control unit 120 comprises at least one switch or circuit-breaker that can turn charging of the battery 40 on and off. In one example the processing circuitry 102 instructs the control unit 120 when and how to charge the battery 40.

The processing circuitry 102 is configured to cause the electronic device 1 to obtain a first State of Health value, SOH1, of the battery 40 at a first time t1 and obtain a second State of Health value, SOH2, of the battery 40 at a second time t2. In one example the first State of Health value, SOH1, and the second State of Health value, SOH2, are time stamped and stored in the memory 101 to be processed by the processing circuitry 102 of the electronic device 1.

The processing circuitry 102 is then configured to cause the electronic device 1 to determine a rate of change of State of Health value, dSOH/dt, of the battery 40 based on the first State of Health value, SOH1, of the battery 40 at the first time t1 and the second State of Health value, SOH2, of the battery at the second time t2. According to an aspect the determination of the rate of that change of State of Health value, dSOH/dt, of the battery 40 is made by determining the slope of a mathematical curve describing the State of Health value over time by the processing circuitry 102. The mathematical curve is described by the State of Health value, SOH1, the second State of Health value, SOH2, the first time t1 and the second time t2.

The processing circuitry 102 is then configured to cause the electronic device 1 to determine a power value by calculating a function (f) that is dependent on the rate of change of State of Health, dSOH/dt, of the battery 40.

According to an aspect the function (f) can be described as PA lim=f(SOC, T, SOH, . . . , dSOH/dt) where SOC represent a State of Health value, T represent a Temperature value, SOH represent a State of Health value.

The processing circuitry 102 is then configured to cause the electronic device 1 to adjust the power limit, PA lim, of the battery 40 to the determined power value for managing the life time of the battery 40. The electronic device 1 is hence configured for adjusting the power limit dependent on the driving behaviour of the vehicle driver in order to meet the designed End of Life value. In one example the power limit, PA lim, of the battery 40 is controlled by the control unit 120.

Figure 2B:
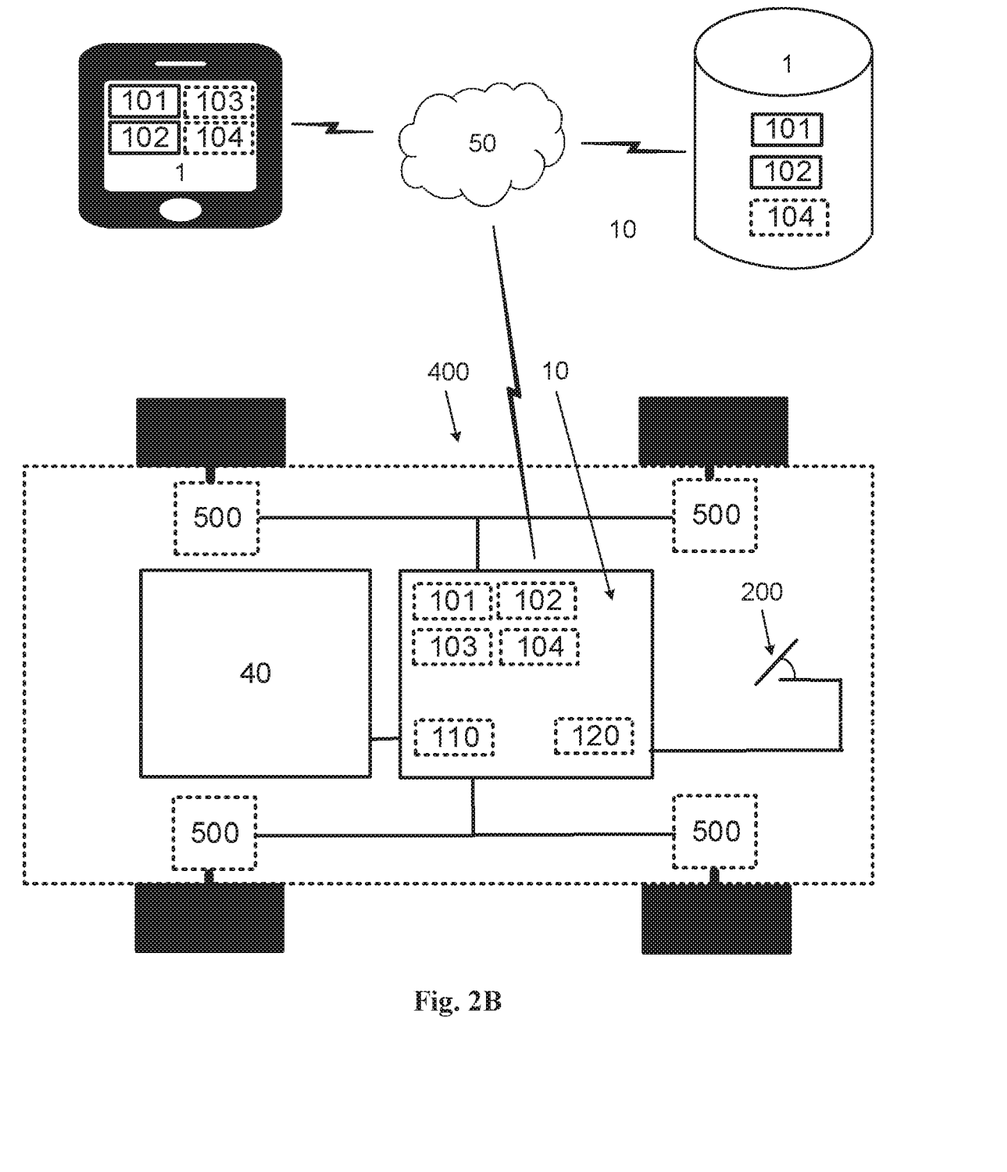
FIG. 2B illustrates an example of an electronic device connected to an electric vehicle according to an aspect.

According to an aspect, as illustrated in FIG. 2B, the electronic device 1 further comprising a communication unit 104 adapted to communicate via a communication network 50. In one example the communication network 50 is a standardized wireless local area network such as a Wireless Local Area Network, WLAN, Bluetooth™, ZigBee, Ultra-Wideband, Near Field Communication, NFC, Radio Frequency Identification, RFID, or similar network. In one example the communication network 50 is a standardized wireless wide area network such as a Global System for Mobile Communications, GSM, Extended GSM, General Packet Radio Service, GPRS, Enhanced Data Rates for GSM Evolution, EDGE, Wideband Code Division Multiple Access, WCDMA, Long Term Evolution, LTE, Narrowband-IoT, 5G, Worldwide Interoperability for Microwave Access, WiMAX or Ultra Mobile Broadband, UMB or similar network. The communication network 50 can also be a combination of both a local area network and a wide area network. The communication network 50 can also be a wired network. According to an aspect the communication network 50 is defined by common Internet Protocols.

FIG. 2B illustrates an exemplary system according to an aspect that is similar to the exemplary system according to FIG. 2A. In the example illustrated with FIG. 2B the electronic device 1 is a portable electronic device, such as a smartphone, tablet or a remote server such as a cloud computing device that is connected to a power limit unit 10 of a vehicle 400 via a communication network 50. According to an aspect the power limit unit 10 comprising a measurement unit 110 and a control unit 120. The power limit unit 10 may further comprise a communication 5 unit 104.

Figure 3:
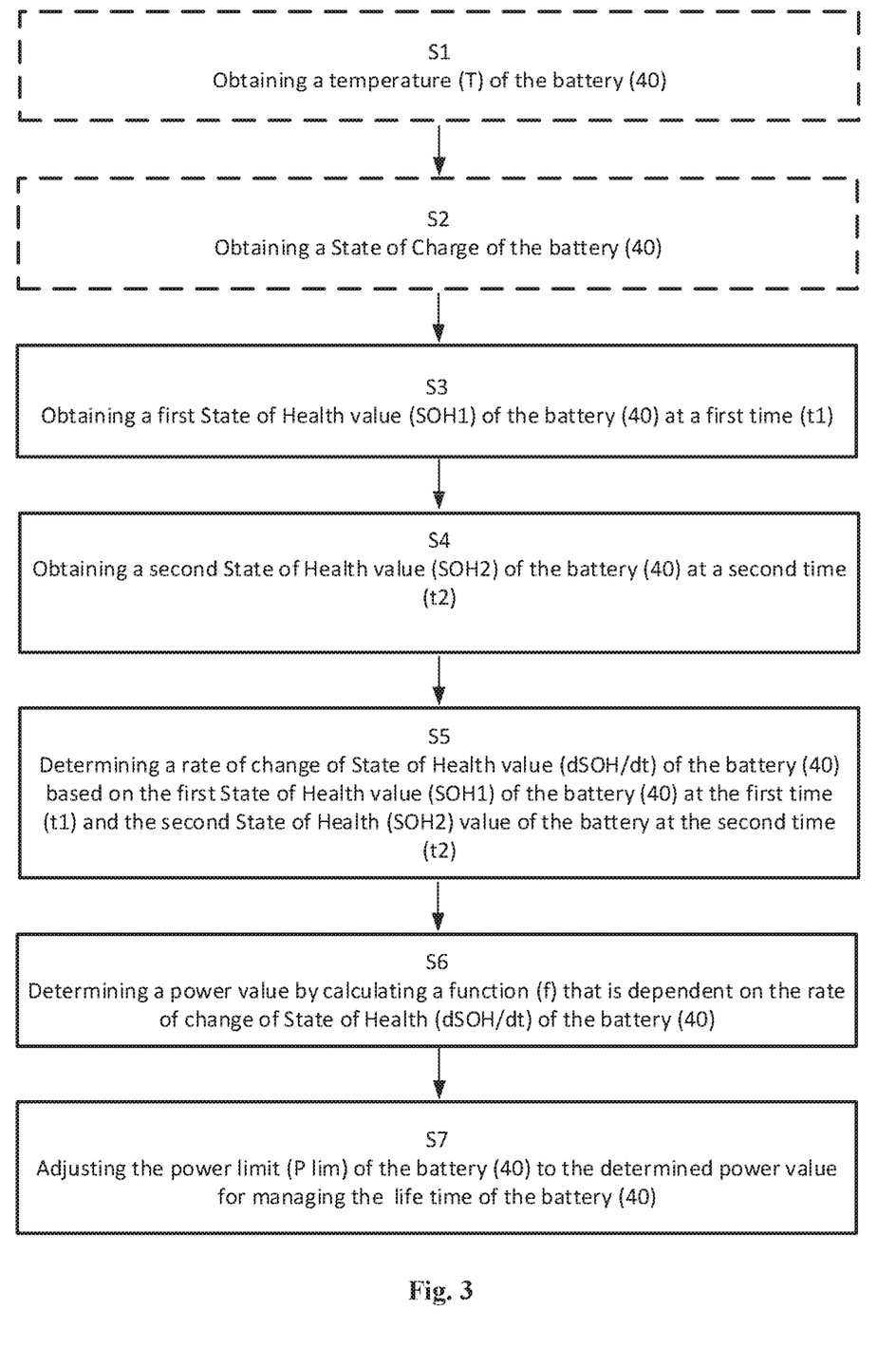
FIG. 3 illustrates a flow chart of the method steps according to an aspect.

The invention further proposes a method performed in an electronic device 1 for managing a power limit PA lim of a battery 40 of a vehicle 10. The method comprising S3 obtaining a first State of Health value, SOH1, of the battery 40 at a first time t1, S4 obtaining a second State of Health value, SOH2, of the battery 40 at a second time t2 and S5 then determining a rate of change of State of Health value, dSOH/dt, of the battery 40 based on the first State of Health value, SOH1, of the battery 40 at the first time t1 and the second State of Health value, SOH2, of the battery at the second time t2. This is then followed by S6 determining a power value by calculating a function (f) that is dependent on the rate of change of State of Health, dSOH/dt, of the battery 40 and S7 adjusting the power limit, PA lim, of the battery 40 to the determined power value for managing the life time of the battery 40. The method is hence adjusting the power limit dependent on the driving behaviour of the vehicle driver in order to meet the designed End of Life value.

In one example use case, a vehicle 400 has a power limit, PA lim that is set to a certain value X. If the method is applied and S6 determining a power value by calculating a function (f) results in that the determined power value is Y, then the power limit, PA lim, is adjusted to Y.

In one example use case, a vehicle 400 has a power limit, PA lim that is set to a certain value X. If the method is applied and S6 determining a power value by calculating a function (f) results in that the determined power value is X, then the power limit (PA lim) is not adjusted.

According to an aspect the power limit, PA lim, is an interval value. In this example if the interval value is 500-1000 and vehicle 400 has a power limit, PA lim, that is set to a certain value "721" and the method is applied and S6 determining a power value by calculating a function (f) results in that the determined power value is "840", then the power limit, PA lim, is not adjusted since the determined power value is within the interval 500-1000.

According to an aspect the method is performed in the electronic device 1 at predefined time intervals. According to an aspect the method is performed in the electronic device 1 more frequent if the rate of change of State of Health value, dSOH/dt, of the battery (40) has been above or below a certain threshold value.

According to an aspect, the first State of Health value, SOH1, and the second State of Health value, SOH2, are obtained by measuring a value corresponding to at least one of the battery capacity or the battery internal impedance. According to an aspect the first State of Health value, SOH1, and the second State of Health value, SOH2, are obtained by measuring a value corresponding to at least one of the battery voltage, the battery internal resistance or the battery internal conductance. Hence the State of Health values are obtained by measuring the same physical indicator of the battery at different times.

According to an aspect, the method further comprising S1 obtaining a temperature T of the battery 40. According to an aspect, the method further comprising S2 obtaining a State of Charge, SOH, of the battery 40. Hence the temperature and/or State of Charge, SOH, can be used as input for managing the power limit.

According to an aspect, wherein S6 determining the power value, the function (f) is further dependent on at least one of the State of Charge, SOC; the Temperature T; or the State of Health, SOH. This means that when determining a power value the function can also be dependent on the State of Charge, SOC; temperature and/or the State of Health, SOH, of the battery 40.

According to an aspect a higher rate of change of State of Health, dSOH/dt, results in S6 determining the power value to be lower than the power limit, PA lim, and access to lower power capabilities for meeting the designed lifetime of the battery 40. In other words, a fast change of the State of Health, SOH, has a negative effect on the End of Life value and in order to minimize the harm to the battery the lower power limit is adjusted down to a lower power limit.

According to an aspect a lower rate of change of State of Health, dSOH/dt, results in S6 determining the power value to be higher than the power limit, PA lim, and access to higher power capabilities for meeting the designed lifetime of the battery 40. In other words, a slow change of the State of Health, SOH, has a positive effect on the End of Life value and in order to maximize the utilization of the battery, the lower power limit is adjusted up to a higher power limit.

According to an aspect S7 adjusting the power limit to a lower power limit, PA lim, is ignored after detecting input from a driver of the vehicle 10 accepting a shortening of the lifetime of the battery 40. This means that a driver of a vehicle can decide that the current driving experience is to be prioritized over the battery lifetime.

According to an aspect S7 adjusting the power limit to a higher power limit, PA lim, is ignored after detecting input from a driver of the vehicle 10 accepting a prolonging of the lifetime of the battery 40. This means that a driver of a vehicle can decide that the battery lifetime is to be prioritized over current driving experience.

According to an aspect the detecting input from a driver is detecting input received via the user interface unit 103. In one example the user interface unit 103 outputs a user interface for interaction with a driver. A driver may be prompted via the user interface unit if the driver wants to accept a shortening of the lifetime of the battery or accept a prolonging of the lifetime of the battery. In one example the user interface unit 103 is a touch sensitive display and the driver can respond by inputting a desired selection via the touch sensitive display.

The invention further proposes a computer program comprising computer-readable code which, when executed by the processing circuitry 102 of the electronic device 1, causes the electronic device 1 to perform the method. Hence the code can be reproduced and run on plural different electronic devices 1 to perform the method. According to an aspect, the method is carried out by instructions in a computer program that is downloaded and run on the electronic device 1. In one example the computer program is a so called app. The app is either free or can be bought by the user of the electronic device 1. The same app can generate a user interface for user interaction via a user interface unit 103 of an electronic device 10. The invention further proposes a computer program product comprising a non-transitory memory storing a computer program. Hence, the memory can maintain the code so that the method can be executed at any time.

In the drawings and specification, there have been disclosed exemplary aspects of the invention. However, many variations and modifications can be made to these aspects. All the different aspects of the invention can be used in any combination. Accordingly, although specific terms are employed, they are used in a generic and descriptive sense only and not for purposes of limitation, the scope of the invention being defined by the following claims.

What is claimed is:

1. A method performed in an electronic device for managing a power limit of a battery of a vehicle, the method comprising:

obtaining a first State of Health value of the battery at a first time, obtaining a second State of Health value of the battery at a second time, determining a rate of change of State of Health value of the battery based on the first State of Health value of the battery at the first time and the second State of Health value of the battery at the second time, determining a power value by calculating a function that is dependent on the rate of change of State of Health of the battery, and adjusting the power limit of the battery to the determined power value for managing the life time of the battery, and wherein a higher rate of change of State of Health results in determining the power value to be lower than the power limit and access to lower power capabilities for meeting the designed lifetime of the battery.

2. The method according to claim 1, wherein the first State of Health value and the second State of Health value are obtained by measuring a value corresponding to at least one of the battery capacity or the battery internal impedance.

3. The method according to claim 1, wherein determining the power value, the function is further dependent on at least one of:
the State of Charge;
the Temperature; or
the State of Health.

4. The method according to claim 1, further comprising: obtaining a temperature of the battery.

5. The method according to claim 1, further comprising: obtaining a State of Charge of the battery.

6. The method according to claim 1, wherein adjusting the power limit to a higher power limit is ignored after detecting input from a driver of the vehicle accepting a prolonging of the lifetime of the battery.

7. A method performed in an electronic device for managing a power limit of a battery of a vehicle, the method comprising:

obtaining a first State of Health value of the battery at a first time, obtaining a second State of Health value of the battery at a second time, determining a rate of change of State of Health value of the battery based on the first State of Health value of the battery at the first time and the second State of Health value of the battery at the second time, determining a power value by calculating a function that is dependent on the rate of change of State of Health of the battery, and adjusting the power limit of the battery to the determined power value for managing the life time of the battery, and wherein a lower rate of change of State of Health results in determining the power value to be higher than the power limit and access to higher power capabilities for meeting the designed lifetime of the battery.

8. The method according to claim 7, wherein adjusting the power limit to a lower power limit is ignored after detecting input from a driver of the vehicle accepting a shortening of the lifetime of the battery.

9. An electronic device configured for managing the life time of a battery in a vehicle, the electronic device comprising:
a memory,
a processing circuitry, configured to cause the electronic device to:
obtain a first State of Health value of the battery at a first time,
obtain a second State of Health value of the battery at a second time,
determine a rate of change of State of Health value of the battery based on the first State of Health value of the battery at the first time and the second State of Health value of the battery at the second time,
determine a power value by calculating a function that is dependent on the rate of change of State of Health of the battery, and
adjust the power limit of the battery to the determined power value for managing the life time of the battery, and
wherein a lower rate of change of State of Health results in determining the power value to be higher than the power limit and access to higher power capabilities for meeting the designed lifetime of the batter.

10. The electronic device according to claim 9, wherein the processing circuitry is configured to obtain the first State of Health value and the second State of Health value by measuring a value corresponding to at least one of the battery capacity or the battery internal impedance.

11. The electronic device according to claim 9, wherein the processing circuitry is further configured to detect input from a driver of the vehicle accepting a prolonging of the lifetime of the battery.

12. An electronic device configured for manacling the life time of a battery in a vehicle, the electronic device comprising:
a memory,
a processing circuitry, configured to cause the electronic device to:
obtain a first State of Health value of the battery at a first time,
obtain a second State of Health value of the battery at a second time,
determine a rate of change of State of Health value of the battery based on the first State of Health value of the battery at the first time and the second State of Health value of the battery at the second time,
determine a power value by calculating a function that is dependent on the rate of change of State of Health of the battery, and
adjust the power limit of the battery to the determined power value for managing the life time of the battery, and
wherein a higher rate of change of State of Health results in determining the power value to be lower than the power limit and access to lower power capabilities for meeting the designed lifetime of the battery.

13. The electronic device according to claim 12, wherein the processing circuitry is further configured to detect input from a driver of the vehicle accepting a shortening of the lifetime of the battery and ignore to adjust the power limit to a lower power limit.

\* \* \* \* \*